(12) United States Patent
Adetutu et al.

(10) Patent No.: US 7,868,389 B2
(45) Date of Patent: Jan. 11, 2011

(54) ELECTRONIC DEVICE COMPRISING A GATE ELECTRODE INCLUDING A METAL-CONTAINING LAYER HAVING ONE OR MORE IMPURITIES

(75) Inventors: Olubunmi O. Adetutu, Austin, TX (US); David C. Gilmer, Austin, TX (US); Philip J. Tobin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 485 days.

(21) Appl. No.: 11/928,314

(22) Filed: Oct. 30, 2007

(65) Prior Publication Data

US 2008/0048270 A1 Feb. 28, 2008

Related U.S. Application Data

(62) Division of application No. 11/046,079, filed on Jan. 28, 2005, now Pat. No. 7,297,588.

(51) Int. Cl.
*H01L 29/76* (2006.01)
(52) U.S. Cl. ..................................... 257/368
(58) Field of Classification Search .......... 257/E27.064, 257/27, 69, 187, 192, 202, 205, 327, 350, 257/288, 900, 338, 351, 357, 360, 368, 369, 257/371, E39.016, E51.062, E27.065, E27.067, 257/E27.099, E27.107, E29.04, E29.05, E29.061, 257/E29.062, E29.117, E29.127, E29.13, 257/E49.002
See application file for complete search history.

(56) References Cited

U.S. PATENT DOCUMENTS 6,444,512 B1 * 9/2002 Madhukar et al. ........... 438/203
6,750,519 B2 6/2004 Lin et al.
6,770,521 B2 * 8/2004 Visokay et al. .............. 438/199

(Continued)

OTHER PUBLICATIONS

Ha, et al., "Molybdenum Gate Work Function Engineering for Ultra-Thin-Body Silicon-on-Insulator (UTB SOI) MOSFETs," Jpn. J. Appl. Phys., Apr. 2003, pp. 1979-1982, vol. 42, Part 1, No. 4B.

(Continued)

*Primary Examiner*—Dao H Nguyen
*Assistant Examiner*—Tram H Nguyen (57) ABSTRACT

One or more impurities may be incorporated within a metal-containing layer of a metal-containing gate electrode to modify the work function of the metal-containing gate electrode of a transistor can affect the threshold voltage of the transistor. In one embodiment, the impurity can be used in a p-channel transistor to allow the work function of a metal-containing gate electrode to be closer to the valence band for silicon. In another embodiment, the impurity can be used in an n-channel transistor to allow the work function of a metal-containing gate electrode to be closer to the conduction band for silicon. In a particular embodiment, a boron-containing species is implanted into a metal-containing layer within the metal-containing gate electrode within a p-channel transistor, so that the metal-containing gate electrode has a work function closer to the valence band for silicon as compared to the metal-containing gate electrode without the boron-containing species.

20 Claims, 2 Drawing Sheets

U.S. PATENT DOCUMENTS

| | | | |
|---|---|---|---|
| 6,891,233 B2 | 5/2005 | Lin et al. | |
| 6,936,508 B2 * | 8/2005 | Visokay et al. | 438/199 |
| 7,033,888 B2 | 4/2006 | Pan et al. | |
| 7,081,656 B2 * | 7/2006 | Eppich et al. | 257/392 |
| 7,651,935 B2 | 1/2010 | Adetutu et al. | |
| 2004/0065930 A1 * | 4/2004 | Lin et al. | 257/412 |
| 2004/0132296 A1 * | 7/2004 | Lin et al. | 438/689 |
| 2004/0175910 A1 * | 9/2004 | Pan et al. | 438/592 |

OTHER PUBLICATIONS

Polishchuk, et al., "Dual Work Function Metal Gate CMOS Transistors by Ni-Ti Interdiffusion," IEEE Electron Device Letters, Apr. 2002, pp. 201-202, vol. 23, No. 4.

Ranade, et al., "Work Function Engineering of Molybdenum Gate Electrodes by Nitrogen Implantation," Electrochemical and Sold-State Letters, The Electrochemical Society, Inc., 2001, pp. G85-G87, University of California at Berkeley, California.

* cited by examiner

ELECTRONIC DEVICE COMPRISING A GATE ELECTRODE INCLUDING A METAL-CONTAINING LAYER HAVING ONE OR MORE IMPURITIES

RELATED APPLICATION

This is a divisional application of and claims priority under 35 U.S.C. §120 to U.S. patent application Ser. No. 11/046,079 entitled "Electronic Device Comprising a Gate Electrode Including a Metal-Containing Layer Having One or More Impurities and a Process For Forming the Same," by Adetutu et al., filed Jan. 28, 2005, which is assigned to the current assignee hereof and incorporated by reference in its entirety.

BACKGROUND

1. Field of the Disclosure

The present disclosure relates to electronic devices, and more particularly to an electronic device comprising a gate electrode including a metal-containing layer having one or more impurities.

2. Description of the Related Art

State-of-the-art semiconductor devices currently include transistors having a gate dielectric layer with one or more high dielectric constant ("high-k") materials. These materials typically have a dielectric constant higher than the silicon nitride, which is approximately seven. Conventional transistors include $N^+$ or $P^+$ doped silicon gate electrodes. One or more problems can occur when a silicon layer contacts a high-k gate dielectric layer. A high-k gate dielectric layer can include a metal oxide, such as $ZrO_2$. When $ZrO_2$ contacts silicon at an elevated temperature, such as during a source/drain anneal, silicon (e.g., from the substrate or a subsequently-formed polysilicon gate electrode) can react with at least some of the zirconium to form $ZrSi_2$, which is conductive. In addition, some of the dopant from the $N^+$ or $P^+$ silicon can migrate from the silicon into the gate dielectric layer or other parts of the transistor. The dopant concentration at the silicon-gate dielectric interface becomes depleted, thereby forming a more resistive portion, which electronically, reduces the electrically measured capacitance of the gate dielectric layer within the transistor, which is undesired.

High-k dielectric materials, including $HfO_2$, $ZrO_2$, etc., when used as a gate dielectric layer typically have metal gate electrodes, due to the potential problems when high-k dielectric materials contact silicon and potential dopant migration into the gate dielectric layer. Exemplary materials for metal gate electrodes include TiN, TaC, TaSiN, and the like.

When a metal gate electrode is used, the portion of metal gate electrode closest to the gate dielectric layer establishes the work function for the gate electrode. An NMOS transistor may have TaSiN as the portion of its metal-containing gate electrode closest to the high-k gate dielectric layer, and a PMOS transistor may have TiN as the portion of its metal-containing gate electrode closest to the high-k gate dielectric layer. The work function for TaSiN is 4.3 eV, and the work function for TiN is 4.6 eV. As a basis for comparison, the work function for $N^+$ silicon and the energy level for the conduction band ("$E_c$") for silicon is 4.1 eV, and the work function for $P^+$ silicon and the energy level for the valence band ("$E_v$") for silicon is 5.2 eV. Therefore, the difference between $E_c$ and the work function for TaSiN is 0.2 eV, and the difference between $E_v$ and the work function for TiN is 0.6 eV. These differences can cause longer times to switch states (i.e., "on" and "off") for the transistors, and therefore, result in a slower operating electronic device.

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

One or more impurities may be incorporated within a metal-containing layer of a metal-containing gate electrode to modify the work function of the metal-containing gate electrode of a transistor, which in turn, can affect the threshold voltage of the transistor. In one embodiment, the impurity can be used in a p-channel transistor to allow the work function of a metal-containing gate electrode to be closer to the valence band for silicon. In another embodiment, the impurity can be used in an n-channel transistor to allow the work function of a metal-containing gate electrode to be closer to the conduction band for silicon. In a particular embodiment, a boron-containing species is implanted into a metal-containing layer within the metal-containing gate electrode within a p-channel transistor, so that the metal-containing gate electrode has a work function closer to the valence band for silicon as compared to the metal-containing gate electrode without the boron-containing species.

In one aspect, a process for forming an electronic device includes forming a first layer of a first gate electrode over a substrate, wherein the first layer includes a first element that is a metallic element. The method also includes incorporating an impurity into the first layer after forming the first layer over the substrate. The impurity comprises a second element within Group 2 or 13 of the Periodic Table.

In one embodiment, the impurity includes a Group 13 element. In a particular embodiment, the impurity includes boron-containing species. In another embodiment, in incorporating the impurity includes implanting the impurity. In another particular embodiment, before implanting the impurity, the first layer includes another element other than silicon.

In still another embodiment, the substrate includes a first portion and a second portion, and the first layer overlies the first portion of the substrate. The process further includes forming a gate dielectric layer over the first and second portions of the substrate before forming the first layer, and forming a second layer over the gate dielectric layer within the second portion of the substrate, wherein a second gate electrode includes at least a portion of the second layer. In a particular embodiment, the process further includes removing the first layer from the second portion of the substrate before forming the second layer, or removing the second layer from the first portion of the substrate before forming the first layer. In another particular embodiment, a PMOS transistor is formed within the first portion of the substrate and includes the first gate electrode. The first layer lies closest to the gate dielectric layer compared to any other layer, if any, within the first gate electrode. An NMOS transistor is formed within the second portion of the substrate and includes the second gate electrode. The second layer lies closest to the gate dielectric layer compared to any other layer, if any, within the second gate electrode. The first gate electrode does not include the second layer, the second gate electrode does not include the first layer, or a combination thereof. In a more particular embodiment, the first gate electrode includes the first and second layers, or the second gate electrode includes the first and second layers.

In yet another embodiment, the process further includes forming a second layer over the first layer, wherein forming the second layer is performed before incorporating the impurity. In a particular embodiment, the second layer is mostly silicon.

In another aspect, an electronic device includes a first gate electrode that includes a first layer. The first layer includes a first element that is a transition metal element, and a second element that is an element within Group 2 or 13 of the Periodic Table.

In one embodiment, the second element includes a Group 13 element. In a particular embodiment, the second element is boron. In another embodiment, the first layer includes a third element other than silicon, wherein the third element is different from the first and second elements.

In still another embodiment, the electronic device further includes a substrate including a first portion and a second portion, a gate dielectric layer overlying the first and second portions of the substrate, and a second layer. The first layer overlies the first portion of the substrate and the gate dielectric layer. The second layer overlies the second portion of the substrate and the gate dielectric layer. In a particular embodiment, the electronic device includes a PMOS transistor within the first portion of the substrate, wherein the PMOS transistor includes the first gate electrode. The first layer lies closest to the gate dielectric layer compared to any other layer, if any, within the first gate electrode. The electronic device includes an NMOS transistor within the second portion of the substrate, wherein the NMOS transistor includes the second gate electrode. The second layer lies closest to the gate dielectric layer compared to any other layer, if any, within the second gate electrode. The first gate electrode does not include the second layer, the second gate electrode does not include the first layer, or a combination thereof. In a more particular embodiment, the first gate electrode includes the first and second layers, or the second gate electrode includes the first and second layers.

In yet another aspect, a process for forming an electronic device includes forming a first layer of a first gate electrode over a substrate, wherein the first layer includes a metallic element. The process also includes implanting a boron-containing species into the first layer.

In one embodiment, the boron-containing species includes B or $BF_2$. In a particular embodiment, the first layer includes an elemental transition metal, a transition metal nitride, a transition metal silicon nitride, or any combination thereof. In another particular embodiment, the substrate includes a first portion and a second portion, and the first layer overlies the first portion of the substrate. The process further includes forming a gate dielectric layer over the first and second portions of the substrate before forming the first layer, and forming a second layer over the gate dielectric layer within the second portion of the substrate, wherein a second gate electrode includes at least a portion of the second layer. In a more particular embodiment, the process further includes removing the first layer from the second portion of the substrate before forming the second layer, or removing the second layer from the first portion of the substrate before forming the first layer.

In an even more particular embodiment, a PMOS transistor is formed within the first portion of the substrate and includes the first gate electrode. The first layer lies closest to the gate dielectric layer compared to any other layer, if any, within the first gate electrode. An NMOS transistor is formed within the second portion of the substrate and includes the second gate electrode. The second layer lies closest to the gate dielectric layer compared to any other layer, if any, within the second gate electrode. The first gate electrode does not include the second layer, the second gate electrode does not include the first layer, or a combination thereof. In a further particular embodiment, the first gate electrode includes the first and second layers, or the second gate electrode includes the first and second layers. In still another further particular embodiment, the process further includes forming a second layer over the first layer, wherein forming the second layer is performed before implanting the boron-containing species. In still a further particular embodiment, the second layer is mostly silicon.

Before addressing details of embodiments described below, some terms are defined or clarified. Group numbers corresponding to columns within the Periodic Table of the elements use the "New Notation" convention as seen in the *CRC Handbook of Chemistry and Physics,* $81^{st}$ Edition (2000).

The term "metal" or any of its variants is intended to refer to a material that includes an element that is within any of Groups 1 to 12, within Groups 13 to 16, an element that is along and below a diagonal line defined by atomic numbers 13 (Al), 32 (Ge), 51 (Sb), and 84 (Po), or any combination thereof. Metal does not include Si. The term "transition metal element" is intended to refer to an element that is within any of Groups 3 to 12.

The term "elemental transition metal" is intended to refer to a transition metal that is not part of a molecule that comprises at least two different elements. For example, Ti atoms that are not chemically bound to any other atoms are considered an elemental transition element; however Ti atoms within TiN are not considered to be an elemental transition metal.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 1:
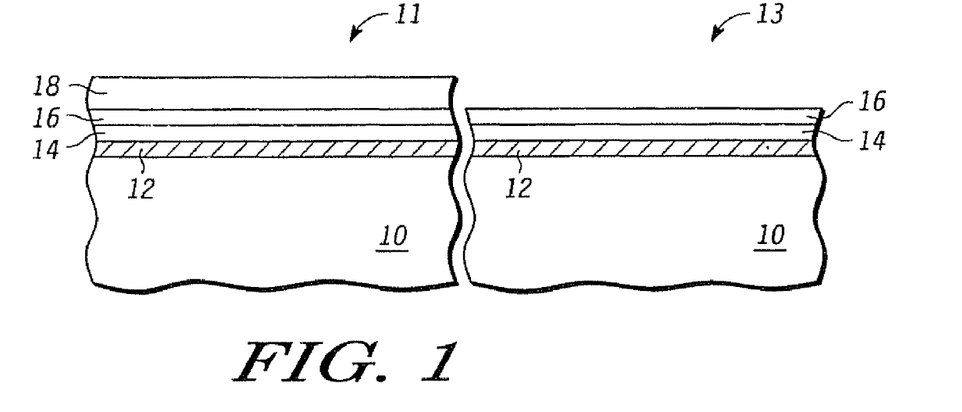
FIG. 1 includes an illustration of cross-sectional views of portions of a semiconductor device substrate after forming a plurality of layers for part of a gate electrode stack.

FIG. 1 includes an illustration of a cross-sectional view of a substrate 10, which includes a PMOS portion 11 and an NMOS portion 13. The substrate 10 can include a monocrystalline semiconductor material, a semiconductor-on-insulator substrate, or nearly any other substrate used in forming semiconductor devices. Within the PMOS portion 11, the substrate 10 may include an n-type dopant, and within the NMOS portion 13, the substrate 10 may include a p-type dopant. In another embodiment, the conductivity types for the dopants may be reversed or may be the same.

Layers are sequentially formed over the substrate 10 within the PMOS and NMOS portions 11 and 13. The layers include a gate dielectric layer 12, a first layer 14, which will the part of the gate electrode within PMOS portion 11, and a hard mask layer 16. The gate dielectric layer 12 has a thickness in a range of approximately 1 to 5 nm, the first layer has a thickness in a range of approximately 5 to 20 nm, and the hard mask layer 16 has a thickness in a range of approximately 10 to 100 nm. Although not illustrated, an interfacial layer of approximately 1 nm may be formed between the substrate 10 and the gate dielectric layer 12 during or prior to the formation of the electronic device.

The gate dielectric layer 12 can include one or more high-k materials, such as $HfO_2$. In another embodiment, the gate dielectric layer 12 can include $HfO_xN_y$, $HfSi_xO_y$, $HfSi_xO_yN_z$, $HfZr_xO_yN_z$, $HfZr_xSi_yO_zN_q$, $HfZrO$, $ZrSi_xO_y$, $ZrSi_xO_yN_z$, $ZrO_2$, other Hf-containing or Zr-containing dielectric material, or any combination thereof. The first layer 14 is compatible with the gate dielectric layer 12 (i.e., does not adversely interact with the gate dielectric layer 12) and has a work function relatively closer to the $E_v$ as compared to other materials that could be used for a gate electrode with a high-k gate dielectric layer. In one embodiment, the first layer 14 includes a metallic element, such as a transition metal element. In a particular embodiment, the first layer 14 includes an elemental transition element (e.g., substantially only atoms of the transition metal). In another embodiment, the first layer 14 may include a second element that, in one embodiment, is any element other than silicon. The first layer may include a third element. The third element may include silicon. Therefore, the first layer 14 can include only one element that is a metallic element, can include only two elements, wherein both of the elements are not silicon, or can include three or more elements, of which, one of the elements may be silicon.

The first layer 14 can include TiN, $Mo_xN_y$, $MoSi_xN_y$, $RuO_2$, $IrO_2$, Ru, Ir, MoSiO, MoSiON, MoHfO, MoHfON, other transition metal containing material, or any combination thereof.

The hard mask layer 16 can include nearly any material that is relatively resistant to etching when portions of the first layer 14 are to be removed. Additionally, when the hard mask layer 16 is subsequently removed after patterning the first layer 14, the hard mask layer 16 will be removed selectively to a remaining portion of the first layer 14. The hard mask layer 16 can include $SiO_2$, $Si_3N_4$, $SiO_xN_y$, or any combination thereof. In one embodiment, the hard mask layer 16 is formed by depositing an oxide layer using tetraethylorthosilicate (TEOS).

The gate dielectric layer 12, first layer 14, hard mask layer 16, or any combination thereof can be formed by depositing an appropriate material using atomic layer deposition, chemical vapor deposition, physical vapor deposition, or the like. In another embodiment, the gate dielectric layer 12, first layer 14, hard mask layer 16, or any combination thereof can include one film or a plurality of films.

A resist layer is formed over the substrate 10 and is patterned to form a resist mask 18, which overlies the hard mask layer 16 within the PMOS portion 11. The resist mask 18 is not formed over the hard mask layer 16 within the NMOS portion 13. In one embodiment, the resist mask 18 is formed by coating or otherwise depositing a photoresist material to form the resist layer, and using a lithographic process to pattern the resist layer to form the resist mask 18. The resist layer may include a negative-acting or positive-acting photoresist material.

Figure 2:
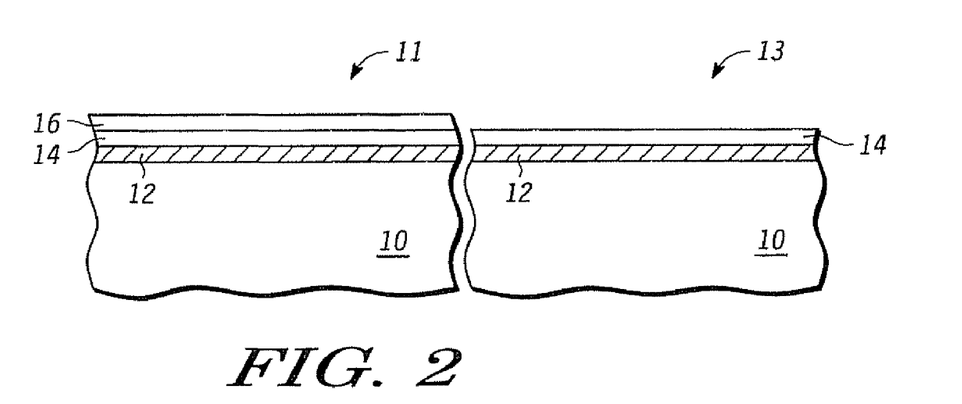
FIG. 2 includes an illustration of cross-sectional views of the portions of the substrate in FIG. 1 after removing a portion of a hard mask layer and a resist mask.

The exposed portion of the hard mask layer 16 is removed from the NMOS portion 13, and the resist mask 18 is then subsequently removed, as illustrated in FIG. 2. The hard mask layer 16 may be removed by using a conventional etching process. The etching is performed such that the hard mask layer 16 is selectively removed as compared to the first layer 14. In one embodiment, etching can be preformed as a wet etch using a dilute HF solution. In one embodiment, the dilute HF solution has at least 10 parts $H_2O$ for each part HF, and in a particular embodiment, the dilute HF solution has at least 100 parts $H_2O$ for each part HF. In another embodiment, etching can be performed as a dry etch. The resist mask 18 is removed using a conventional ashing technique.

At this point in the process, a remaining portion of the hard mask layer 16 lies within the PMOS portion 11, and a portion of the first layer 14 is exposed within the NMOS portion 13. The exposed portion of the first layer 14 is removed from the NMOS portion 13. The hard mask layer 16 protects the portion of the first layer 14 within the PMOS portion 11, such that it is not removed. The first layer 14 may be removed by using a conventional etching process. The etching is performed such that the first layer 14 is selectively removed as compared to the hard mask layer 16. In one embodiment, etching can be preformed as a wet etch using a dilute $NH_4OH$ solution. In one embodiment, the dilute $NH_4OH$ solution has at least 10 parts $H_2O$ and $H_2O_2$ for each part $NH_4OH$, and in a particular embodiment, the dilute $NH_4OH$ solution has at least 100 parts $H_2O$ and $H_2O_2$ for each part $NH_4OH$. In another embodiment, etching can be performed as a dry etch.

Figure 3:
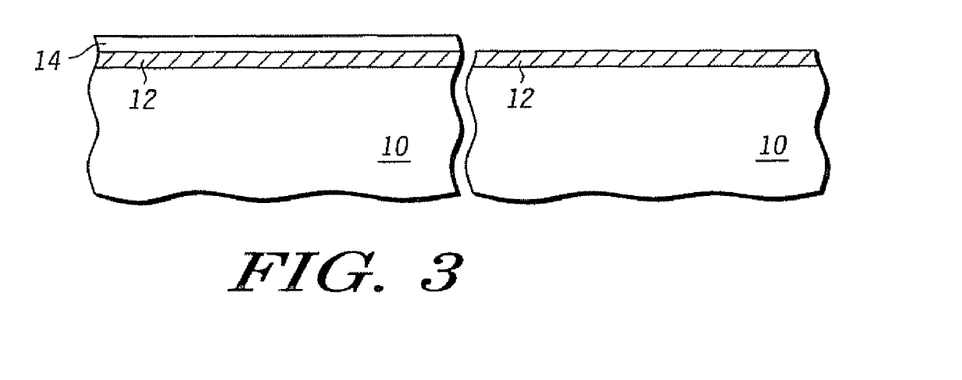
FIG. 3 includes an illustration of cross-sectional views of the portions of the substrate in FIG. 2 after removing a portion of a first layer of a gate electrode and the remaining portion of the hard mask layer.
Figure 4:
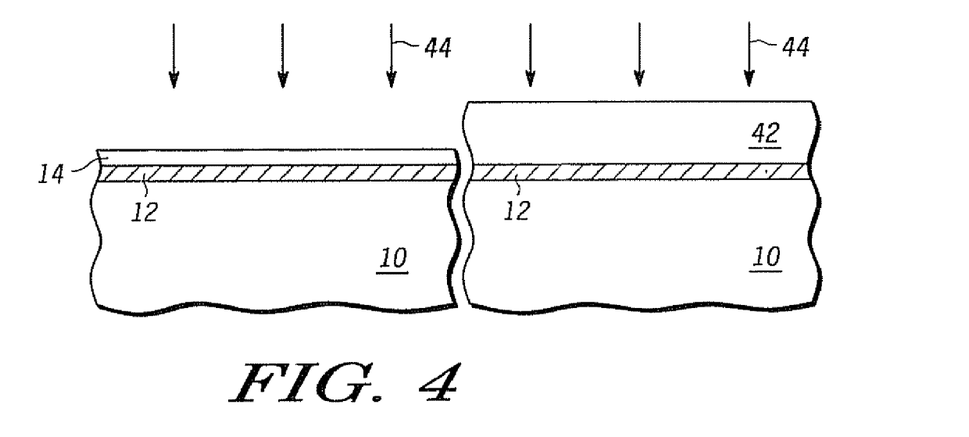
FIG. 4 includes an illustration of cross-sectional views of the portions of the substrate in FIG. 3 during ion implantation.

After the exposed portion of the first layer 14 is removed, the remaining portion of the hard mask layer 16 within the PMOS portion 11 is removed, as illustrated in FIG. 3. The hard mask layer 16 may be removed by using a conventional etching process. The etching is performed such that the hard mask layer 16 is selectively removed as compared to the first layer 14 and the gate dielectric layer 12. In one embodiment, etching can be preformed as a wet etch using a dilute HF solution. In one embodiment, the dilute HF solution has at least 10 parts $H_2O$ for each part HF, and in a particular embodiment, the dilute HF solution has at least 100 parts $H_2O$ for each part HF. In another embodiment, etching can be performed as a dry etch may be used A dopant mask 42 is formed over the gate dielectric layer 12 within the NMOS portion 13, as illustrated in FIG. 4. The dopant mask 42 can be formed using any one or more conventional techniques for forming a resist mask. In one embodiment, the process is substantially the same as described for the resist mask 18. The thickness of the dopant mask 42 is sufficient to substantially prevent a significant amount of ions from reaching the gate dielectric layer 12 within the NMOS portion 13 during a subsequent ion implanting act. In one embodiment, the dopant mask 42 includes a photoresist material and has a thickness in a range of approximately 100 to 1000 nm.

An impurity is then introduced into the exposed portion of the first layer 14 by implanting ion as illustrated in with arrows 44 in FIG. 4. The impurity can include an element within Group 2 or 13 of the Periodic Table. The dose and energy used for the ion implantation may depend at least in part on the species to be implanted. In one embodiment, the impurity includes a Group 13 element. In one specific embodiment, $B^+$ is implanted to a dose in a range of 1E14 to 1E16 ions/cm$^2$ and at an energy in a range of approximately 0.5 to 20 KeV. In another specific embodiment, $BF_2^+$ is implanted to a dose in a range of 1E14 to 1E16 ions/cm$^2$ and at an energy in a range of approximately 1 to 30 KeV. In still another embodiment, the impurity can include $Be^+$.

In one embodiment, the range for the dose may be approximately the same as it is for the $B^+$ or $BF_2^+$ embodiment. The energy for implanting the other species can be chosen such that the projected range ($R_p$) and straggle ($\Delta R_p$) are about the same as they are for the boron-containing species. However, a different species may diffuse differently as compared to $B^+$ or $BF_2^+$. Therefore, in another embodiment, $R_p$ may need to be determined for each species due to a different diffusivity during subsequent thermal cycles. After reading this specification, skilled artisans will be able to consult ion implantation tables to choose the proper energy based on the species selected.

After the impurity has been introduced, the dopant mask 42 is removed. If the dopant mask includes a resist material, the dopant mask 42 can be removed using a conventional ashing technique. If the dopant mask 42 includes a hard mask layer, it will be removed selective to the gate dielectric layer 12 and the remaining portion of the first layer 14 within the PMOS portion 11. If desired, an optional anneal may be performed to anneal damage caused by the ion implantation. The optional anneal can be performed using an inert gas (e.g., $N_2$, a noble gas, or a combination thereof), at a temperature in a range of approximately 400 to 700° C. for a time in a range of approximately 0.5 to 2 minutes. In one embodiment, the concentration of the impurity within the first layer 14 can be less than 10 atomic %, and in a particular embodiment, less than 3 atomic %.

Figure 5:
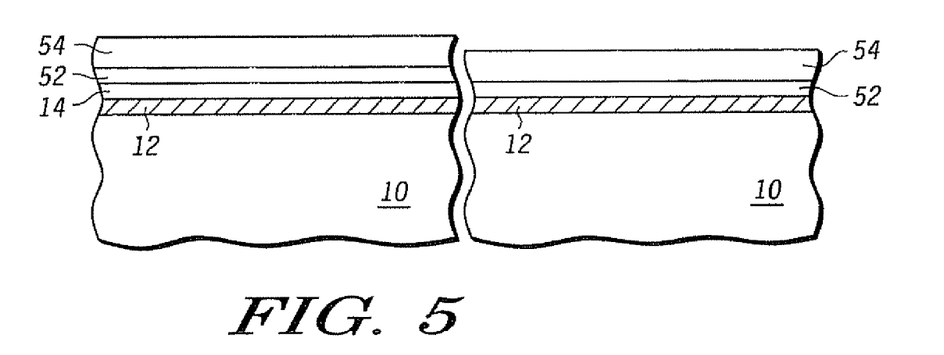
FIG. 5 includes an illustration of cross-sectional views of the portions of the substrate in FIG. 4 after forming the remaining layers of the gate electrode stacks in accordance with an embodiment.

A second layer 52 and a third layer 54 are then sequentially formed over the substrate 10 within the PMOS and NMOS portions 11 and 13. The second layer 52 determines the work function for the gate electrode being formed within the NMOS portion 13. In this embodiment, the second layer 52 includes a material having a work function relatively close to $E_c$. For example, the second layer 52 can include TaC, TaSiN, TaN, TaSiC, HfC, NbC, TiC, NiSi, or any combination thereof. The third layer 54 includes one or more materials. In one embodiment, the third layer 54 includes heavily doped amorphous silicon or polycrystalline silicon, a metal silicide, or a combination thereof.

The first, second, and third layers 14, 52, and 54 will be subjected to a temperature of 300° C. or higher during subsequent processing acts in forming the electronic device. One such act may include a source/drain anneal that may be performed at a temperature in a range of approximately 500-1100° C. In another embodiment, laser annealing may be performed at a temperature in a range of approximately 500C to 1350° C. The actual materials selected for the first layer 14, the second layer 52, and the third layer 54 can depend on potential interactions that are to be avoided between layers that contact or are adjacent to each other, particularly at elevated temperatures (i.e., significantly above room temperature). After reading this specification, skilled artisans will be able to select proper materials for the layers 12, 52, and 54 from a wide array of materials and still be able to avoid interactions that are undesired.

Figure 6:
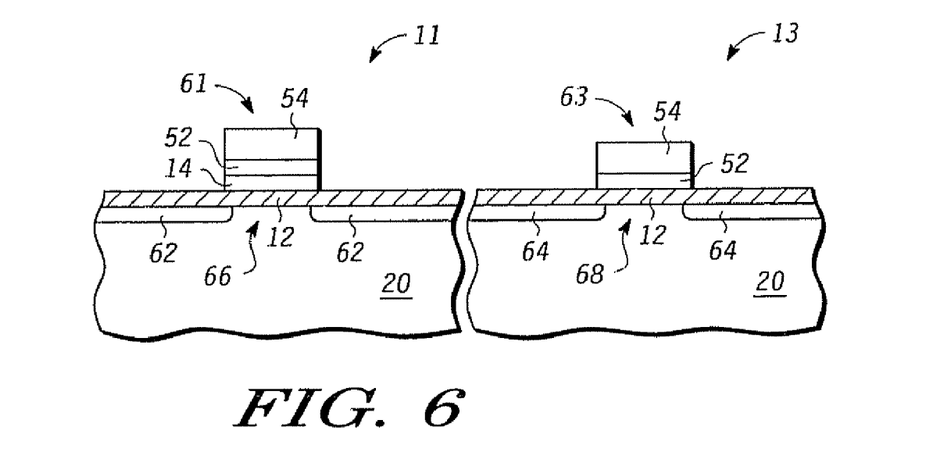
FIG. 6 includes an illustration of cross-sectional views of the portions of the substrate in FIG. 5 after forming gate electrodes and source/drain regions for transistors in accordance with an embodiment.

The layers within the gate stacks are patterned to form a gate electrode 61 within the PMOS portion 11 and a gate electrode 63 within the NMOS portion 13, as illustrated in FIG. 6. The patterning is performed using a conventional technique. The gate electrode 61 includes portions of the first, second, and the third layers 12, 52, and 54. The gate electrode 63 includes portions of the second and the third layers 52 and 54. Ion implantation is performed to form $P^+$ source/drain regions 62 within the PMOS portion 11, and $N^+$ source/drain regions 64 within the NMOS portion 13. An anneal may be performed to activate the implanted dopants within the $P^+$ and $N^+$ source/drain regions 62 and 64. Channel regions 66 and 68 lie within the substrate 10 between the $P^+$ and $N^+$ source/drain regions 62 and 64. At this point in the process, a PMOS transistor and an NMOS transistor have been formed.

Although not illustrated, one or more insulating layers and one or more wiring layers are formed over the substrate 10. A passivation layer and an optional alpha particle protection layer (e.g., polyimide) are deposited to form a substantially completed electronic device. Such layers and their processes for formation are conventional to skilled artisans. After processing of the electronic device is substantially completed, the concentration of the impurity that was introduced into the first layer 14 (in FIG. 4) is greater than the concentration of the same impurity within the channel region 66.

Many modifications can be used to the embodiments described above. For example, the second layer 52 may be formed and patterned before forming the first layer 14. In this embodiment, the hard mask layer 16 overlies the second layer 52 and is used during the removal of the second layer 52 from the PMOS portion 11 before the first layer 14 is formed. In this embodiment, the first layer may be formed over the second layer 52 before forming the third layer 54. In another embodiment, a lithographic sequence can be performed to remove the portion of the first layer 14 from the NMOS portion 13 before the third layer 54 is formed. Along similar lines and referring to FIG. 5, the portion of the second layer 52 within the PMOS portion 11 can be removed before forming the third layer 54. Therefore, the first layer 14 is not required within the NMOS portion 13, and the second layer 52 is not required within the PMOS portion 11.

In another embodiment, implantation can be performed through at least part of a layer within the third conductive layer 54. In this embodiment, the second conductive layer 52 within the PMOS portion 11 is removed before any portion of the third conductive layer 54 is formed. A relatively thinner layer that is part of the third conductive layer 54 is formed on the first layer 14 within the PMOS portion 11 before ion implantation is performed. The thickness of the thinner layer may be in a range of approximately 1 to 10 nm. The energy used for the ion implantation may the increased to account for this additional portion present during the ion implant. In one embodiment, the thinner layer includes amorphous silicon to reduce the effects of implant channeling. After the ion implantation and optional anneal, a relatively thicker layer that is part of the third layer 54 is then formed over the thinner layer. The thickness of the thicker layer is in a range of approximately 10 to 100 nm.

In still another embodiment, implantation can be performed through a sacrificial layer. For example, a sacrificial layer having a thickness of approximately 1 to 10 nm is deposited over the first layer 14 within the PMOS portion 11, as illustrated in FIG. 3. After forming the dopant mask 42 and performing the implantation, the sacrificial layer can be removed. In one embodiment the sacrificial layer includes $SiO_2$, $Si_3N_4$, $SiO_xN_y$, or the like.

In yet another embodiment, the impurity may be incorporated using one or more dopant gases. Referring to FIG. 4, a gas including $B_2H_6$, $PH_3$, $POCl_3$, $AsH_3$, or the like may be exposed to the portion of the first layer 14 within the PMOS portion 11 and the dopant mask 42. If the gas exposure is performed at a temperature of approximately 50° C. or higher, the dopant mask may include an inorganic material, such as $SiO_2$, $Si_3N_4$, $SiO_xN_y$, or the like. An optional anneal may be performed. The dopant mask 42 is removed using a conventional technique. Other processing activities are performed substantially the same as previously described.

In a further embodiment, an impurity can be introduced into the second layer 52 within the NMOS portion 13. Any one of the impurities and introduction methods as previously described with respect to the impurity for the first layer 14 may be used.

Unexpectedly, the embodiments described herein have improved performance in that the impurity incorporated within the layer of the gate electrode closest to the gate dielectric layer 12 (first layer 14 for the PMOS portion 11, and second layer 52 for the NMOS portion 13) can be used to modify the work function of that layer to be closer to $E_v$ or $E_c$. Many options are available for metal-containing gate electrode materials. For example, in one embodiment, the metal-containing gate electrode, without any impurity, may have a work function closer to $E_c$ and the impurity can be added to the metal-containing gate electrode to get the work function closer to $E_v$, or vice versa. In another embodiment, a midband gap material may be used for the metal-containing gate electrode. One impurity can be used to get the work function closer to $E_v$, and another impurity can be used to get the work function closer to $E_c$. In this manner, the same material for the metal gate electrode can be deposited, and different impurities used to get the work function tailored more closely to $E_v$ for PMOS transistors and $E_c$ for NMOS transistors. A wider variety of materials can be used for gate electrodes with impurities used to more closely achieve desired work function(s) for the transistors within the electronic device.

EXAMPLE

The invention will be further described in the following example, which does not limit the scope of the invention described in the claims. The example below demonstrates that the work function of a gate electrode can be changed by incorporating an impurity into a metallic layer.

PMOS transistors can be formed to include a $HfO_2$ gate dielectric layer having a thickness in a range of approximately 1.5 to 10 nm. The gate electrodes for the PMOS transistors include a TiN layer having a thickness of approximately 10.0 nm. For different substrates, the TiN layer does not receive an implant, is implanted with $B^+$ (low or high energy implant), or is implanted with $BF_2^+$ (low or high energy). Table 1 below includes data regarding implant species, dose, and energy used for the example. After the implant, if any, a TaSiN layer having a thickness of approximately 10 nm and a polysilicon layer having a thickness of approximately 100 nm are sequentially deposited over the TiN layer. Source/drain regions are formed using a conventional technique.

TABLE 1

| Species | Dose (ions/cm$^2$) | Energy (KeV) | Φ (eV) |
|---|---|---|---|
| No implant | — | — | 4.6 |
| $B^+$ | 4E15 | 1.5 (low) | 4.7 |
| $BF_2^+$ | 4E15 | 6.5 (low) | 4.8 |
| $B^+$ | 4E15 | 3.5 (high) | 5.2 |
| $BF_2^+$ | 4E15 | 15.0 (high) | 5.1 |

The flat band voltages are determined for a variety of equivalent oxide thicknesses ("EOTs"). The EOT is an electrical measurement of a thickness of an insulator, as opposed to a physical measurement of the thickness. The work functions of the gate electrodes of the PMOS transistors are determined from the flat band voltages and EOTs. Table 1 includes the calculated work functions. The data indicate that the boron-containing species within the TiN layer increase the work function, and the higher energy implants produce work functions closer to $E_v$. The work function improves by 0.2 to 0.3 electron volts when implanting at relatively lower energies as compared to performing no implant. The work function improves by 0.5 to 0.6 electron volts when implanting at relatively higher energies as compared to performing no implant. The use of the impurity incorporation can change the work function more than just by merely switching metal-containing materials for the layer(s) that determine the work function for a gate electrode. Similar effects may be seen when impurities are added to the second layer 52 to get the work function closer to $E_c$.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

What is claimed is:

1. An electronic device comprising:
a substrate including a first portion and a second portion;
a gate dielectric layer overlying the first portion and the second portion of the substrate;
a first gate electrode overlying the gate dielectric layer and the first portion of the substrate, wherein:
the first gate electrode includes a first portion of a first layer, a first portion of a second layer, and a first portion of a third layer, wherein the second layer lies between the first layer and the third layer;
the first portion of the first layer lies immediately adjacent to the gate dielectric layer; and
the first layer comprises a first element that is a metallic element and an impurity that includes a second element within Group 2 or 13 of the Periodic Table;
a first source/drain region overlying the first portion of the substrate, wherein a first transistor includes the first source/drain and the first gate electrode;
a second gate electrode overlying the gate dielectric layer and the second portion of the substrate, wherein:
the second gate electrode includes a second portion of the second layer and a second portion of the third layer; and
the second portion of the second layer lies immediately adjacent to the gate dielectric layer; and
a second source/drain region overlying the second portion of the substrate, wherein a second transistor includes the second source/drain and the second gate electrode.

2. The electronic device of claim 1, wherein the impurity comprises a boron-containing species.

3. The electronic device of claim 1, wherein the second gate electrode does not include the first layer.

4. The electronic device of claim 1, wherein:
the first transistor is a PMOS transistor;
the first layer substantially determines a work function of the PMOS transistor;
the second transistor is an NMOS transistor; and
the second layer substantially determines a work function of the NMOS transistor.

5. An electronic device comprising:
a substrate including a first portion and a second portion;
a first transistor overlying the first portion of the substrate, wherein the first transistor includes:
a first channel region;
a first gate dielectric layer overlying the first channel region; and
a first gate electrode overlying the first gate dielectric layer, wherein:
the first gate electrode includes a first layer lying immediately adjacent to the first gate dielectric layer; and
the first layer includes:
a first element that is a first transition metal element; and
a second element that is an element within Group 2 or 13 of the Periodic Table; and
a second transistor overlying the second portion of the substrate, wherein the second transistor includes:
a second channel region;
a second gate dielectric layer overlying the second channel region; and
a second gate electrode overlying the second gate dielectric layer, wherein:
the second gate electrode includes a second layer; and
the second layer includes a third element that is a second transition metal element, and the second layer does not include boron.

6. The electronic device of claim 5, wherein the second element is boron.

7. The electronic device of claim 5, wherein the first transition metal element is different from the second transition metal element.

8. The electronic device of claim 7, wherein the first gate dielectric layer and the second gate dielectric layer are different portions of a same gate dielectric layer.

9. The electronic device of claim 5, wherein each of the first gate dielectric layer and the second gate dielectric layer includes hafnium, zirconium, or any combination thereof.

10. The electronic device of claim 5, wherein the first layer comprises a fourth element other than silicon, wherein the fourth element is different from the first and second elements.

11. The electronic device of claim 5, wherein the first transistor is a PMOS transistor, and
the second transistor is an NMOS transistor.

12. The electronic device of claim 11, wherein the first layer comprises TiN, and
the third layer comprises TaSiN.

13. The electronic device of claim 5, wherein the first gate electrode does not include the second layer, and the second gate electrode does not include the first layer.

14. An electronic device comprising:
a substrate including a first portion and a second portion;
a gate dielectric layer overlying the first portion and the second portion of the substrate;
a first transistor overlying the first portion of the substrate and comprising a first gate electrode and a first source/drain region, wherein:
the first gate electrode overlies the gate dielectric layer;
the first gate electrode includes a first layer and a second layer;
the first layer includes a first metallic element and substantially determines a work function for the first electrode; and
the first source/drain region lies adjacent to the first gate electrode; and
a second transistor overlying the second portion of the substrate and comprising a second gate electrode and a second source/drain region, wherein:
the second gate electrode overlies the gate dielectric layer;
the second gate electrode includes the second layer and a third layer;
the third layer includes a second metallic element and a boron-containing species, and the third layer substantially determines a work function of the second gate electrode; and
the second source/drain region lies adjacent to the second gate electrode, wherein:
the first metallic element is different from the second metallic element; and
the first layer does not include the second metallic element. or the third layer does not include the first metallic element.

15. The electronic device of claim 14, wherein the second layer comprises an elemental transition metal, a transition metal nitride, a transition metal silicon nitride, or any combination thereof.

16. The electronic device of claim 14, wherein:
the first transistor is a NMOS transistor;
the first layer lies immediately adjacent to the gate dielectric layer;

the second transistor is a PMOS transistor; and
the third layer lies immediately adjacent to the gate dielectric layer.

17. The electronic device of claim 16, wherein first gate electrode does not include the third layer, and the second gate electrode does not include the first layer.

18. The electronic device of claim 16, wherein first gate electrode includes the third layer, and the second gate electrode does not include the first layer, 19. The electronic device of claim 16, wherein the first gate electrode includes a different number of layers as compared to the second gate electrode, 20. The electronic device of claim 14, wherein:
the first metallic element includes Ta, Hf, Nb, or NiSi; and
the second metallic element includes Ti, Mo, Ru, Ir, or Mo.

* * * * *